(12) United States Patent
Liu

(10) Patent No.: US 8,183,103 B2
(45) Date of Patent: May 22, 2012

(54) INTEGRATED CIRCUIT STRUCTURE INCLUDING SCHOTTKY DIODE AND METHOD FOR MANUFACTURING THE SAME

(75) Inventor: Yan-Hsiu Liu, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 158 days.

(21) Appl. No.: 12/717,429

(22) Filed: Mar. 4, 2010

(65) Prior Publication Data

US 2011/0215474 A1 Sep. 8, 2011

(51) Int. Cl.
*H01L 21/338* (2006.01)
*H01L 29/66* (2006.01)

(52) U.S. Cl. ........ 438/167; 438/534; 257/280; 257/471; 257/E29.388; 257/E21.047; 257/E21.64; 257/E21.173; 257/E21.186; 257/E21.368; 257/E21.374; 257/E21.425; 257/E21.458

(58) Field of Classification Search .......................... None
See application file for complete search history.

(56) References Cited

U.S. PATENT DOCUMENTS

| | | | |
|---|---|---|---|
| 3,906,540 A | | 9/1975 | Hollins |
| 6,855,970 B2 * | | 2/2005 | Hatakeyama et al. ........ 257/264 |
| 7,638,403 B2 * | | 12/2009 | Cheng ........................... 438/305 |
| 7,701,031 B2 * | | 4/2010 | Cheng ........................... 257/476 |
| 2005/0062124 A1 * | | 3/2005 | Chiola ........................... 257/476 |
| 2007/0252228 A1 * | | 11/2007 | Cheng ........................... 257/471 |

OTHER PUBLICATIONS

Qingfen Wang et al. "Ultra-Shallow Junction Formation Using Silicide as a Diffusion source and Low thermal Budget", IEEE transactions on electron devices, vol. 39, No. 11 Nov. 1992; p. 2486-2496.
H. Okabayashi, et al.; "Low Resistance MOS Technology Using Self-Aligned Refractory-Silicidation"; Microelectronics Research Labs., Nippon Electronic Co., Ltd. Miyamae-Ku, Kawasaki 213 Japan; IEEE; Page from IEDM-82-556 to IEDM-82-560.

* cited by examiner

*Primary Examiner* — Alonzo Chambliss
(74) *Attorney, Agent, or Firm* — Chun-Ming Shih

(57) ABSTRACT

A method for manufacturing an integrated circuit structure is disclosed. First, a dielectric layer is formed on a substrate, the substrate has a transistor region and a diode region. Next, a contact hole and an opening are formed in the dielectric layer, a size of the opening being larger than that of the contact hole. Next, a first metal layer is formed on the dielectric layer and filled into the contact hole and the opening. Next, a portion of the first metal layer is removed to form a contact plug above the transistor region and form a metal spacer on a sidewall of the opening. Next, an ion implantation process is performed to form a lightly doped region in the substrate at a bottom of the opening. Finally, a contact metal layer is formed on the lightly doped region.

20 Claims, 4 Drawing Sheets

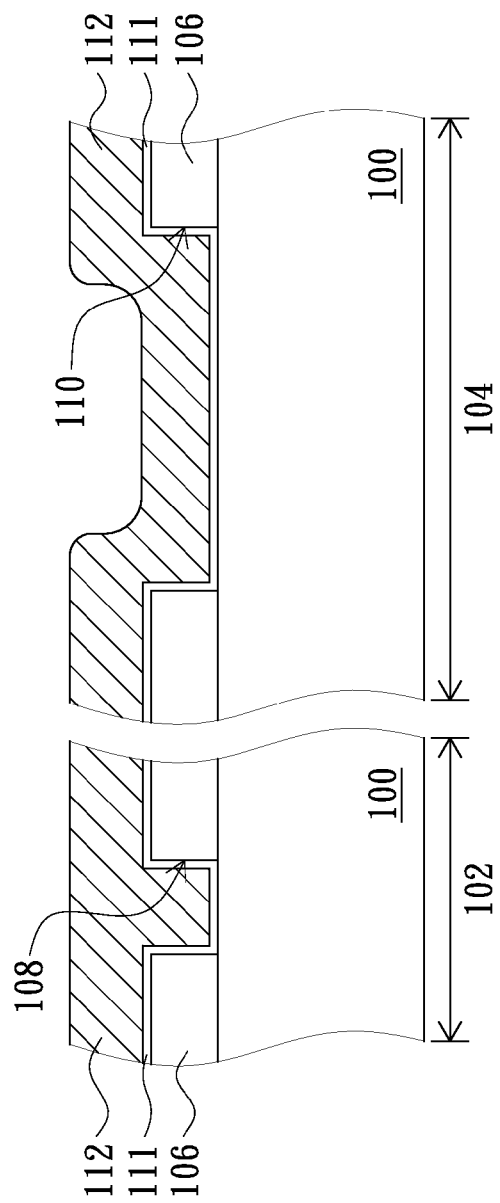
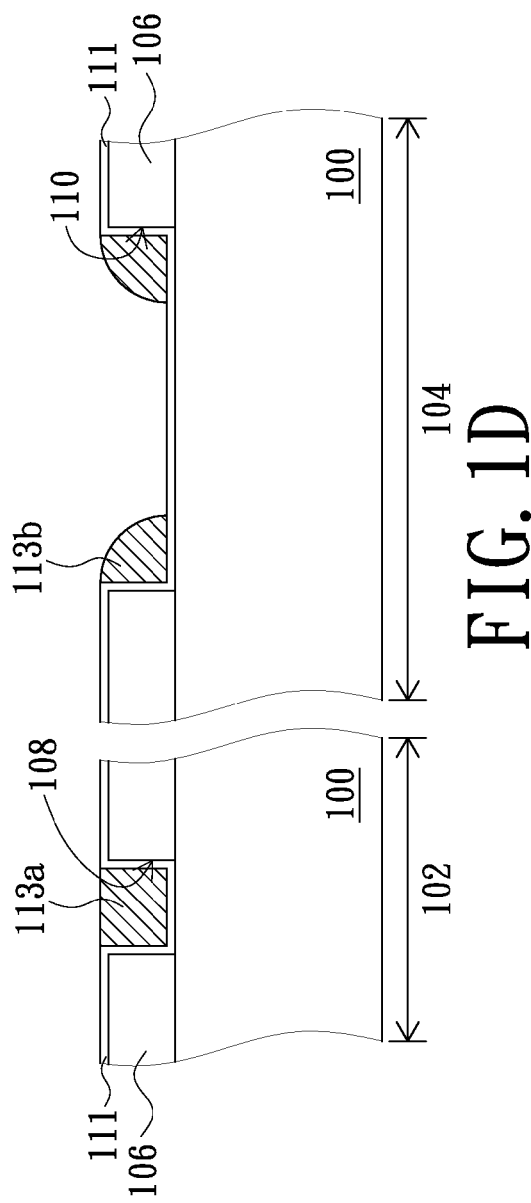
FIG. 1C
FIG. 1D

INTEGRATED CIRCUIT STRUCTURE INCLUDING SCHOTTKY DIODE AND METHOD FOR MANUFACTURING THE SAME

BACKGROUND

1. Field of the Invention

The present invention relates to an integrated circuit structure and a method for manufacturing the same, and more particularly to an integrated circuit structure that can integrate with a Schottky diode therein and a method for manufacturing the same.

2. Description of the Related Art

In the integrated circuit industry, the metal semiconductor contact diodes as one of basic components are extremely important in electronic systems. In particular, Schottky diodes have some advantages of high switching speed, low conduction voltage drop and low noise figure, so that they can be widely used, for example, in power supply switches, motor control drives, telecommunication switches and electronic automation.

In the past, the Schottky diode was made by various methods and structures in the integrated circuit industry. The Schottky diode is a surface contact diode that is composed of a lightly doped semiconductor layer and a metal layer. The Schottky diode achieves rectification by utilizing the work function difference between the lightly doped semiconductor layer and the metal layer thereon.

Generally, in an integrated circuit structure, the Schottky diode is first manufactured on a chip, and then the Schottky diode is integrated with other semiconductor components on another chip by steps of designing and assembling.

However, with the rapid development of the integrated circuit process technology, size of the various components is continuously getting smaller. As such, it is desired that the Schottky diode and other semiconductor components can be integrated on a chip, so as to increase integration of the integrated circuit structure.

What is needed, therefore, is a new integrated circuit structure and a method for manufacturing the same that can integrate a Schottky diode with good performances and another semiconductor component on the same chip, and the semiconductor component may not be adversely influenced.

BRIEF SUMMARY

The present invention relates to a method for manufacturing an integrated circuit structure, that can integrate a diode with good performances and another semiconductor component on the same chip, and the semiconductor component may not be adversely influenced.

The present invention also relates to an integrated circuit structure that has a diode with good performances and another semiconductor component on the same chip.

The present invention provides a method for manufacturing an integrated circuit structure. The method includes the following steps. First, a dielectric layer is formed on a substrate having a transistor region and a diode region. Next, a contact hole and an opening are formed in the dielectric layer simultaneously, wherein the contact hole exposes a portion of the substrate at the transistor region and the opening exposes a portion of the substrate at the diode region, and a size of the opening is larger than that of the contact hole. Next, a first metal layer is formed on the dielectric layer, and the first metal layer is filled into the contact hole and the opening. Next, a portion of the first metal layer is removed to form a contact plug above the transistor region and simultaneously form a metal spacer on a sidewall of the opening. Next, an ion implantation process is performed by using the metal spacer as a mask, so as to form a lightly doped region in the substrate at a bottom of the opening. Finally, a contact metal layer is formed on the lightly doped region.

In one embodiment, the method further includes forming a barrier layer to conformally cover the dielectric layer, before forming the first metal layer. Material of the barrier layer can include titanium, titanium nitride, tantalum or tantalum nitride. In another embodiment, during the process of forming the contact metal layer, a portion of the barrier layer disposed on the dielectric layer may also be removed. During the process of removing the portion of the first metal layer, a portion of the barrier layer may also be removed.

In one embodiment, a buffer layer is further formed between the contact metal layer and the lightly doped region.

In one embodiment, a method of forming the contact metal layer includes: forming a second metal layer on the dielectric layer appropriately; and patterning the second metal layer to form the contact metal layer. Material of the second metal layer can be different from that of the first metal layer. The material of the second metal layer can be selected from the group consisting of aluminum, copper, molybdenum, aurum, platinum or any combination thereof. In the period of patterning the second metal layer, a conducting wire can also be formed on the contact plug.

In one embodiment, material of the first metal layer can be selected from the group consisting of tungsten, copper, molybdenum, aurum, platinum and any combination thereof.

The present invention also provides an integrated circuit structure. The integrated circuit structure includes a substrate, a dielectric layer, a contact plug, a lightly doped region and a contact metal layer. The substrate has a transistor region and a diode region. The dielectric layer is disposed on a substrate, the dielectric layer defines a contact hole and an opening therein, wherein the contact hole exposes a portion of the substrate at the transistor region and the opening exposes a portion of the substrate at the diode region, and a size of the opening being larger than that of the contact hole. The contact plug is disposed in the contact hole of the dielectric layer. The metal spacer is disposed on a sidewall of the opening of the dielectric layer. The lightly doped region is disposed in the substrate at a bottom of the opening that is not covered by the metal spacer and an edge of the lightly doped region is aligned with an edge of the metal spacer. The contact metal layer is disposed on the lightly doped region.

In one embodiment, the integrated circuit structure further includes a barrier layer at least disposed on sidewalls of the contact hole, between two of the metal spacer, the substrate and the dielectric layer. Material of barrier layer can include titanium, titanium nitride, tantalum or tantalum nitride.

In one embodiment, the integrated circuit structure further includes a buffer layer disposed between the contact metal layer and the lightly doped region.

In one embodiment, the integrated circuit structure further includes a conducting wire disposed on the contact plug. Material of the conducting wire can be the same to that of the contact metal layer, which can be selected from the group consisting of aluminum, copper, molybdenum, aurum, platinum and any combination thereof.

In one embodiment, material of the contact plug is the same as that of the metal spacer, which can be selected from the group consisting of tungsten, copper, molybdenum, aurum, platinum and any combination thereof.

In the method for manufacturing the integrated circuit structure of the present invention, a contact hole and an opening with larger size than the contact hole are formed in the dielectric layer simultaneously, and a portion of the substrate at a bottom of the opening is used as contact surface of the diode. The contact metal layer and the lightly doped region can be fabricated above or under the bottom of the opening in the process of forming the contact window, so as to form the Schottky diode. Therefore, the Schottky diode can be formed on the same chip with a common logic element. And thus the method for manufacturing the integrated circuit structure of the present invention not only can reduce the cost of design and assembly, but also can greatly improve the integrity of the device.

In addition, in the method for manufacturing the integrated circuit structure of the present invention, by controlling conditions of the ion implantation process, a diode with good performances can be formed without using the extra mask, and the other semiconductor component may not be adversely influenced.

BRIEF DESCRIPTION OF THE DRAWINGS

These and other features and advantages of the various embodiments disclosed herein will be better understood with respect to the following description and drawings, in which like numbers refer to like parts throughout, and in which:

FIGS. 1A to 1F are cross-sectional schematic views of an integrated circuit structure at stages in a manufacturing process according to an embodiment of the present invention.

DETAILED DESCRIPTION

FIGS. 1A to 1F are cross-sectional schematic views of an integrated circuit structure at stages in a manufacturing process according to an embodiment of the present invention.

Figure 1A:
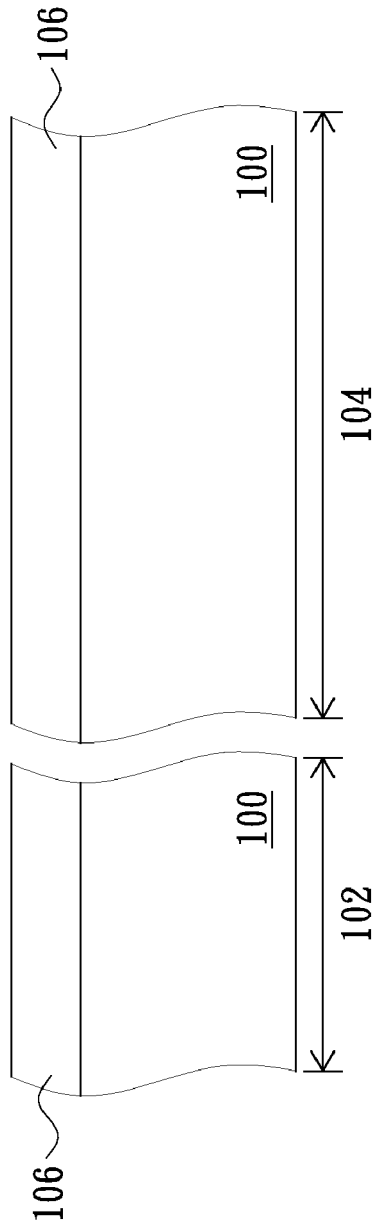

Referring to FIG. 1A, in a method for manufacturing the integrated circuit structure, first, a substrate 100 is provided. The substrate 100 has a transistor region 102 and a diode region 104. A logic element such as a MOS element or a memory element can be disposed on the transistor region 102 of the substrate 100. In addition, some inner dielectric layers or intermetal dielectric layers (not shown) can be formed on the substrate 100, and numbers or configuration of the layers can be designed according to the requirements of the device.

Next, a dielectric layer 106 is formed on the substrate 100. Material of the dielectric layer 106 can be silicon oxide. The dielectric layer 106 may be formed by a chemical vapor deposition process.

Figure 1B:
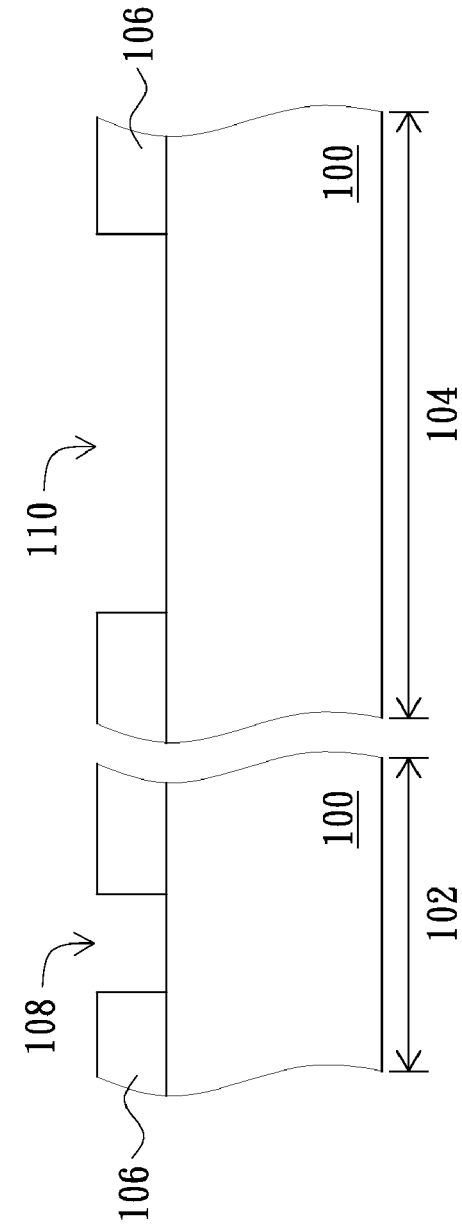

Next, referring to FIG. 1B, the dielectric layer 106 is patterned so that a contact hole 108 and an opening 110 are formed in the dielectric layer 106 simultaneously. A size of the opening 110 is larger than that of the contact hole 108. The contact hole 108 may expose a portion of the substrate 100 at the transistor region 102. For example, the contact hole 108 exposes a gate, a source, a drain or an interconnection structure of the logic element. The opening 110 exposes a portion of the substrate 100 at the diode region 104. A surface exposed by opening 110 can be used as a contact surface subsequently.

In addition, a method of patterning the dielectric layer 106, for example, includes the following steps. First, a patterned photoresist layer (not shown) is formed on the dielectric layer 106, which exposes a portion of the dielectric layer 106 above the transistor region 102 and the diode region 104. Next, using the patterned photoresist layer as a mask, the exposed portion of the dielectric layer 106 is removed by, for example, by a dry etching or a wet etching process, so that the contact hole 108 and the opening 110 are formed.

Next, referring to FIG. 1C, a first metal layer 112 is formed on the dielectric layer 106 and filled into the contact hole 108 and the opening 110. Material of the first metal layer 112 can be selected from the group consisting of tungsten, copper, molybdenum, aurum, platinum and any suitable combination thereof. The first metal layer 112 may be formed by a chemical vapor deposition process.

In the embodiment, before the first metal layer 112 is formed, a barrier layer 111 can be formed. The barrier layer 111 may prevent metal and silicon from diffusing with each other. Material of the barrier layer 111 can be selected from the group consisting of titanium, titanium nitride, tantalum, tantalum nitride, tungsten nitride, titanium tungsten nitride, nickel, zinc, zinc nitride, chromium, chromium nitride and any suitable combination thereof. The barrier layer 111 may be formed by a chemical vapor deposition process.

Next, referring to FIG. 1D, a portion of the first metal layer 112 is removed, and another portion of the first metal layer 112 above the transistor region 102 is retained to form a contact plug 113a. In addition, the size of the opening 110 is larger than that of the contact hole 108, so after the portion of the first metal layer 112 is removed, a metal spacer 113b can be formed on a sidewall of the opening 110 with the contact plug 113a.

The process of removing the portion of the first metal layer 112 can be performed by an etching back process, or chemical mechanical polishing process and then etching back process.

It should be understood that, during the process of removing the portion of the first metal layer, the portion of barrier layer 111 in the opening can be retained or removed depending on the requirements of the device.

Figure 1E:
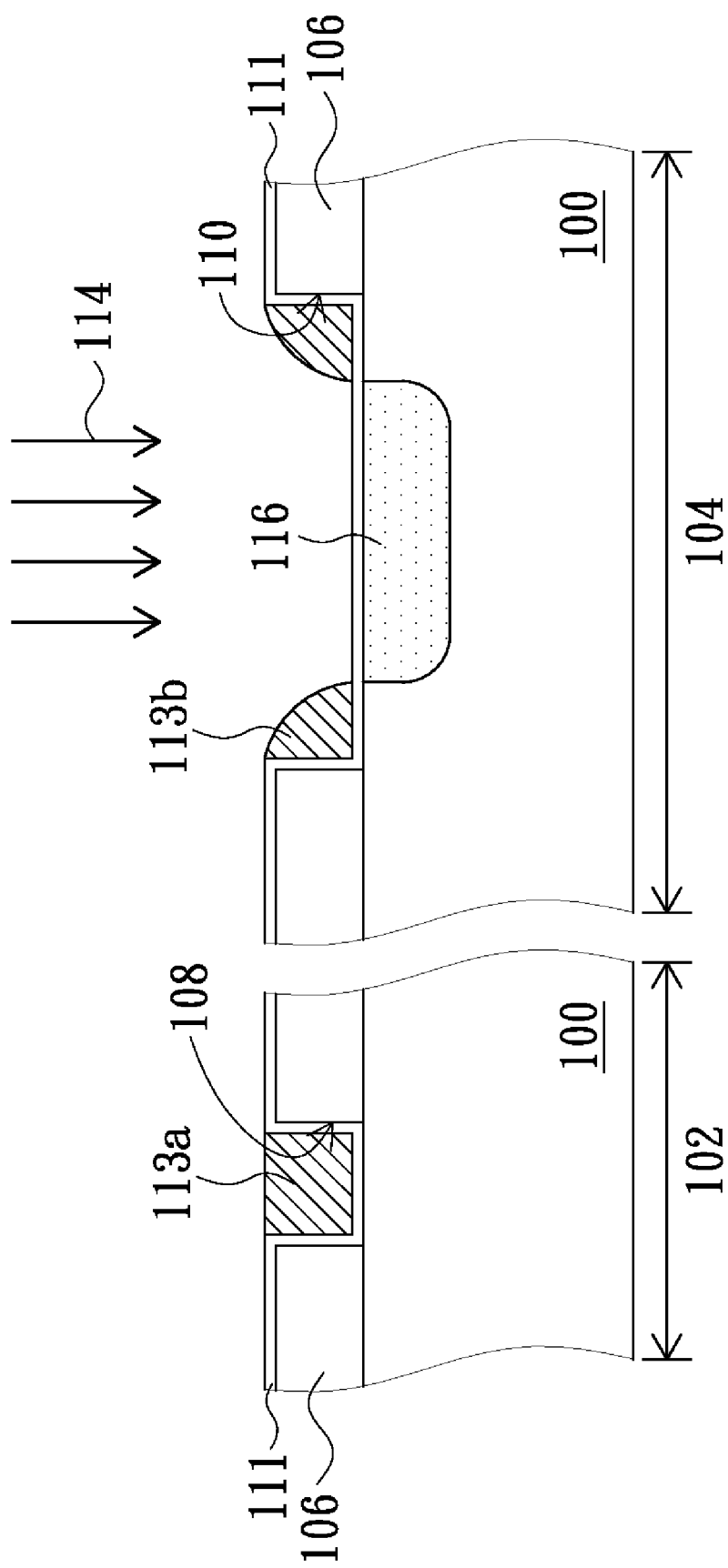

Next, referring to FIG. 1E, an ion implantation process 114 is performed by using the metal spacer 113b as a mask so as to form a lightly doped region 116 in the diode region 104. In detail, the lightly doped region 116 is formed in a portion of the substrate 100 that is at a bottom of the opening 110 and not covered by the metal spacer 113b.

It should be understood that, using the metal spacer 113b as the mask, an additional mask can be omitted. As such, a process of forming the lightly doped region 116 in the substrate 100 at the bottom of the opening 110 can be simplified. In addition, by controlling conditions of the ion implantation process 114, a diode with good performances can be formed, and the other semiconductor component may not be adversely influenced.

Figure 1F:
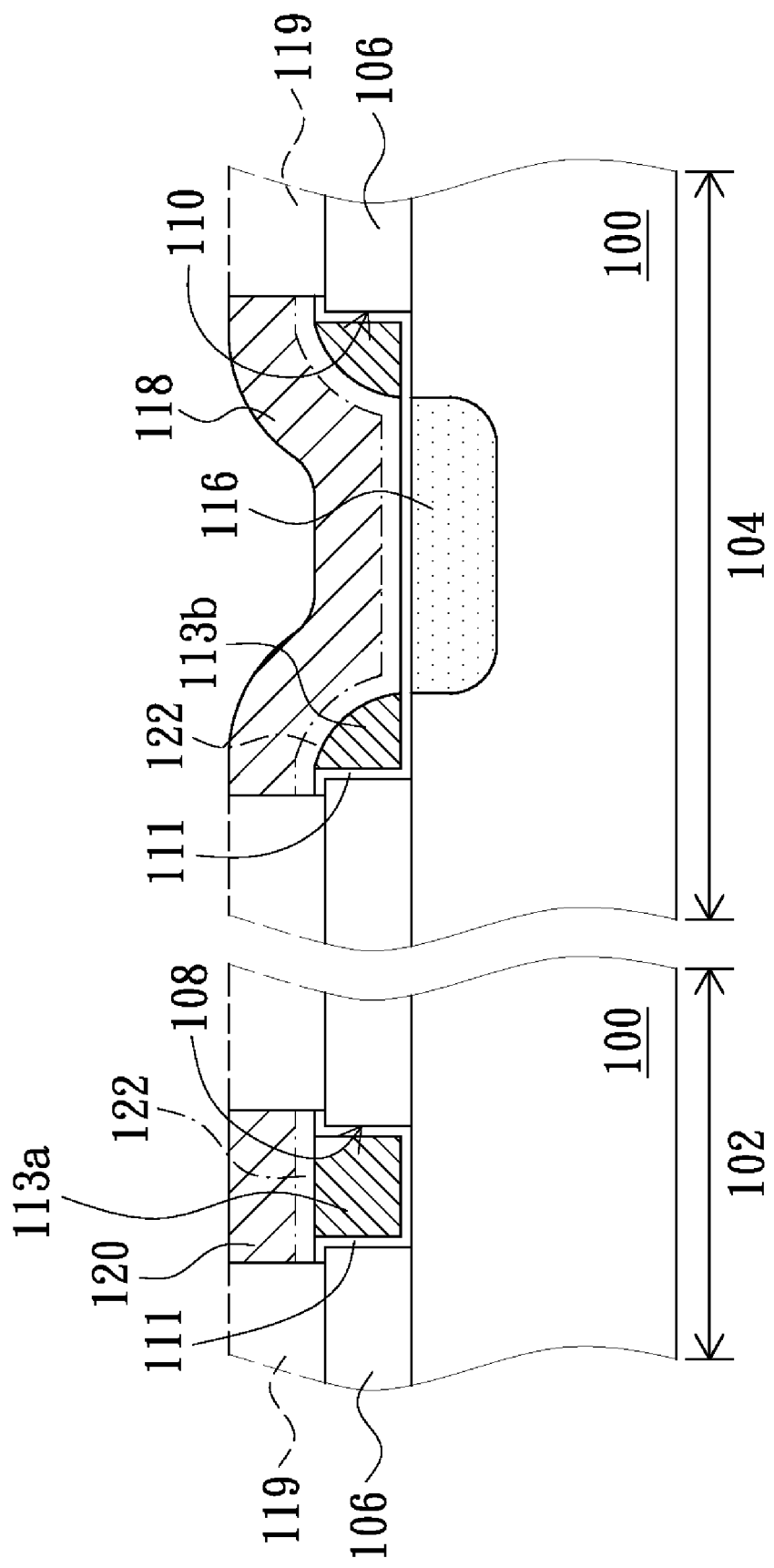

Next, referring to FIG. 1F, a contact metal layer 118 is formed on the lightly doped region 116. In the embodiment, during the process of forming the contact metal layer, a portion of the barrier layer disposed on the dielectric layer is also removed. The contact metal layer 118 and the lightly doped region 116 under the contact metal layer 118 can compose a Schottky diode, and that is a metal semiconductor contact diode.

A method of forming the contact metal layer 118 may include the following steps. First, a second metal layer 119 is formed on the dielectric layer 106 appropriately to cover the whole chip. Then the second metal layer 119 is patterned, so as to form the contact metal layer 118 in the opening 110 above the diode region 104. Moreover, when the second metal layer 119 is patterned, a conducting wire 120 can be formed on the contact plug 113a above the transistor region 102. Material of the second metal layer 119 is different from that of the first metal layer 112. The material of the second metal layer 119 can be selected from the group consisting of aluminum, copper, molybdenum, aurum, platinum and any suitable combination thereof, or can be aluminum silicon alloy.

The second metal layer 119 may be formed by a physical vapor deposition or chemical vapor deposition process.

In the embodiment, a buffer layer 122 can be formed between the contact metal layer 118 and the lightly doped region 116, so as to avoid cross contamination between the metal and silicon. The buffer layer 122 can also be disposed between the conducting wire 120 and the contact plug 113a. Material of the buffer layer 122 can be selected from the group consisting of titanium, titanium nitride, tantalum, tantalum nitride, tungsten nitride, titanium tungsten nitride, nickel, zinc, zinc nitride, chromium, chromium nitride or any suitable combination thereof. A method of forming the buffer layer 122 can include the steps of forming a buffer material layer (not shown) before forming the second metal layer 119, and then removing a portion of the buffer material layer to form the buffer layer 122 while patterning the second metal layer 119. It should be understood that, the buffer layer 122 can be selectively arranged depending on the requirements of the device.

In the method for manufacturing the integrated circuit structure of the present embodiment, the Schottky diode can be fabricated simultaneously in the process of forming the contact window so that the Schottky diode can be formed on the same chip with the common logic element.

As such, the method for manufacturing the integrated circuit structure of the present embodiment not only can reduce the cost of design and assembly, but also can greatly improve the integrity of the device.

Particularly, in the method for manufacturing the integrated circuit structure of the present embodiment, by controlling conditions of the ion implantation process, a diode with good performances can be formed without using the extra mask, and the other semiconductor component may not be adversely influenced.

Referring to FIG. 1F, an integrated circuit structure according to an embodiment of the present invention will be described as follows. The method or material for manufacturing the structure has been described above, and it will not be repeated here.

Referring to FIG. 1F again, the integrated circuit structure includes a substrate 100, a dielectric layer 106, a contact plug 113a, a metal spacer 113b, a lightly doped region 116 and a contact metal layer 118. The substrate 100 has a transistor region 102 and a diode region 104.

The dielectric layer 106 is disposed on the substrate 100. The dielectric layer 106 defines a contact hole 108 and an opening 110 therein. A size of the opening 110 is larger than that of the contact hole 108. The contact hole 108 exposes a portion of the substrate 100 at the transistor region 102. The opening 110 exposes a portion of the substrate 100 at the diode region 104.

The metal spacer 113b is disposed on a sidewall of the opening 110. The contact plug 113a is disposed in the contact hole 108. Material of the metal spacer 113b can be the same to that of the contact plug 113a. The metal spacer 113b and the contact plug 113a can be formed simultaneously.

In the embodiment, a barrier layer 111 can be at least disposed on sidewalls of the contact hole 108. The barrier layer 111 can also be at least disposed between each two of the metal spacer 113b and the substrate 100 and the dielectric layer 106. The barrier layer 111 may prevent metal and silicon from diffusing with each other.

In addition, the contact metal layer 118 and the lightly doped region 116 can compose a Schottky diode. The lightly doped region 116 is disposed in the substrate 100 at the bottom of the opening 110. The lightly doped region 116 is not covered by the metal spacer 113b and an edge of the lightly doped region 116 is aligned with an edge of the metal spacer 113b. The contact metal layer 118 is disposed on the lightly doped region 116, and in contact with the lightly doped region 116. Material of the contact metal layer 118 is different from that of the metal spacer 113b.

In an alternative embodiment, a conducting wire 120 is disposed on the contact plug 113a. Material of the conducting wire 120 can be the same to that of the contact metal layer 118. The conducting wire 120 and the contact metal layer 118 can be formed simultaneously.

In addition, a buffer layer 122 can be formed between the contact metal layer 118 and the lightly doped region 116. The buffer layer 122 can also be disposed between the conducting wire 120 and the contact plug 113a. The buffer layer 122 may prevent metal and silicon from diffusing with each other.

In summary, the present invention may integrate the Schottky diode and another semiconductor component on the same chip, thereby reducing manufacturing cost and greatly improving the integrity of the device. Furthermore, by controlling conditions of the ion implantation process, a required diode can be formed without using the extra mask, and the other semiconductor component may not be adversely influenced.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A method for manufacturing an integrated circuit structure, comprising:
    forming a dielectric layer on a substrate having a transistor region and a diode region;
    forming a contact hole and an opening in the dielectric layer simultaneously, the contact hole exposing a portion of the substrate at the transistor region, the opening exposing a portion of the substrate at the diode region, and a size of the opening being larger than that of the contact hole;
    forming a first metal layer on the dielectric layer and filling the contact hole and the opening;
    removing a portion of the first metal layer to form a contact plug above the transistor region and simultaneously form a metal spacer on a sidewall of the opening;
    performing an ion implantation process by using the metal spacer as a mask, so as to form a lightly doped region in the substrate at a bottom of the opening; and
    forming a contact metal layer on the lightly doped region.

2. The method for manufacturing an integrated circuit structure claimed in claim 1, further comprising forming a barrier layer to conformally cover the dielectric layer before forming the first metal layer.

3. The method for manufacturing an integrated circuit structure claimed in claim 2, wherein during the step of forming the contact metal layer, a portion of the barrier layer disposed on the dielectric layer is also removed.

4. The method for manufacturing an integrated circuit structure claimed in claim 2, wherein during the step of removing the portion of the first metal layer, a portion of the barrier layer is also removed.

5. The method for manufacturing an integrated circuit structure claimed in claim 2, wherein material of the barrier layer comprises titanium, titanium nitride, tantalum or tantalum nitride.

6. The method for manufacturing an integrated circuit structure claimed in claim 1, wherein a buffer layer is further formed between the contact metal layer and the lightly doped region.

7. The method for manufacturing an integrated circuit structure claimed in claim 1, wherein a method of forming the contact metal layer comprises:
   forming a second metal layer on the dielectric layer appropriately; and
   patterning the second metal layer to form the contact metal layer.

8. The method for manufacturing an integrated circuit structure claimed in claim 7, wherein during the step of patterning the second metal layer, a conducting wire is also formed on the contact plug.

9. The method for manufacturing an integrated circuit structure claimed in claim 7, wherein material of the second metal layer is different from that of the first metal layer.

10. The method for manufacturing an integrated circuit structure claimed in claim 7, wherein material of the second metal layer is selected from the group consisting of aluminum, copper, molybdenum, aurum, platinum and any combination thereof.

11. The method for manufacturing an integrated circuit structure claimed in claim 1, wherein material of the first metal layer is selected from the group consisting of tungsten, copper, molybdenum, aurum, platinum and any combination thereof.

12. An integrated circuit structure, comprising:
   a substrate having a transistor region and a diode region;
   a dielectric layer disposed on a substrate, the dielectric layer defining a contact hole and an opening therein, the contact hole exposing a portion of the substrate at the transistor region, the opening exposing a portion of the substrate at the diode region, and a size of the opening being larger than that of the contact hole;
   a contact plug disposed in the contact hole of the dielectric layer;
   a metal spacer disposed on a sidewall of the opening of the dielectric layer;
   a lightly doped region disposed in the substrate at a bottom of the opening that is not covered by the metal spacer and an edge of the lightly doped region is aligned with an edge of the metal spacer; and
   a contact metal layer disposed on the lightly doped region.

13. The integrated circuit structure claimed in claim 12, further comprising a barrier layer at least disposed on sidewalls of the contact hole, between two of the metal spacer, the substrate and the dielectric layer.

14. The integrated circuit structure claimed in claim 13, wherein material of barrier layer comprises titanium, titanium nitride, tantalum or tantalum nitride.

15. The integrated circuit structure claimed in claim 12, further comprising a buffer layer disposed between the contact metal layer and the lightly doped region.

16. The integrated circuit structure claimed in claim 12, further comprising a conducting wire disposed on the contact plug.

17. The integrated circuit structure claimed in claim 16, wherein material of the conducting wire is the same as that of the contact metal layer.

18. The integrated circuit structure claimed in claim 16, wherein material of the conducting wire and the contact metal layer is selected from the group consisting of aluminum, copper, molybdenum, aurum, platinum and any combination thereof.

19. The integrated circuit structure claimed in claim 12, wherein material of the contact plug is the same to that of the metal spacer.

20. The integrated circuit structure claimed in claim 19, wherein the material of the contact plug and the metal spacer is selected from the group consisting of tungsten, copper, molybdenum, aurum, platinum and any combination thereof.

* * * * *